United States Patent
Jang et al.

(10) Patent No.: US 9,196,682 B2
(45) Date of Patent: Nov. 24, 2015

(54) NANOPARTICLE COMPLEX, METHOD OF MANUFACTURING THE SAME, AND DEVICE INCLUDING THE NANOPARTICLE COMPLEX

(75) Inventors: Hyo-Sook Jang, Yongin-si (KR); Eun-Joo Jang, Suwon-si (KR); Shin-Ae Jun, Seongnam-si (KR); Seok-Hwan Hong, Seoul (KR); Soo-Kyung Kwon, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 508 days.

(21) Appl. No.: 12/901,061

(22) Filed: Oct. 8, 2010

(65) Prior Publication Data
US 2011/0084250 A1   Apr. 14, 2011

(30) Foreign Application Priority Data
Oct. 9, 2009  (KR) .................. 10-2009-0096480

(51) Int. Cl.
| | | |
|---|---|---|
| *H01L 33/04* | (2010.01) | |
| *H01L 29/66* | (2006.01) | |
| *C08G 79/00* | (2006.01) | |
| *H01L 29/06* | (2006.01) | |
| *B82Y 10/00* | (2011.01) | |
| *C09K 11/02* | (2006.01) | |

(Continued)

(52) U.S. Cl.
CPC ............. *H01L 29/0665* (2013.01); *B82Y 10/00* (2013.01); *C09K 11/02* (2013.01); *C09K 11/025* (2013.01); *C09K 11/565* (2013.01); *C09K 11/70* (2013.01); *H05B 33/14* (2013.01); *H01L 33/502* (2013.01)

(58) Field of Classification Search
CPC .......... B82Y 30/00; B82Y 5/00; B82Y 20/00; B82Y 10/00; B82Y 40/00; B82Y 25/00; B82Y 15/00; H01L 27/14601; H01L 31/036; H01L 21/02601; H01L 31/035218; H01L 21/02551; H01L 21/0256; H01L 21/02562
USPC ............. 257/13, 14; 528/9, 13; 428/407, 402, 428/402.2; 523/205, 206, 201
See application file for complete search history.

(56) References Cited

U.S. PATENT DOCUMENTS 7,151,047 B2   12/2006   Chan et al.
8,153,022 B2   4/2012   Ryowa
(Continued)

FOREIGN PATENT DOCUMENTS

JP   2008-540726 A   11/2008
JP   2011-026472 A   2/2011
(Continued)

OTHER PUBLICATIONS

Japanese Office Action for Japanese patent application No. 2010-229008 dated Sep. 9, 2014.
(Continued)

*Primary Examiner* — James J Seidleck
*Assistant Examiner* — S. Camilla Pourbohloul
(74) *Attorney, Agent, or Firm* — Cantor Colburn LLP

(57) ABSTRACT

A nanoparticle complex, including a semiconductor nanocrystal; and a metal complex ligand on the surface of the semiconductor nanocrystal. The nanoparticle complex may further include a polymer shell contacting the metal complex ligand.

21 Claims, 14 Drawing Sheets
(3 of 14 Drawing Sheet(s) Filed in Color)

(51) Int. Cl.
*C09K 11/56* (2006.01)
*C09K 11/70* (2006.01)
*H05B 33/14* (2006.01)
*H01L 33/50* (2010.01)

(56) References Cited

U.S. PATENT DOCUMENTS

| | | |
|---|---|---|
| 8,552,417 B2 | 10/2013 | Taylor et al. |
| 8,597,730 B2 | 12/2013 | Pickett et al. |
| 2008/0038558 A1* | 2/2008 | Landry et al. .......... 428/403 |
| 2009/0098663 A1* | 4/2009 | Han et al. .......... 436/525 |
| 2009/0263656 A1 | 10/2009 | Chae et al. |
| 2010/0068522 A1* | 3/2010 | Pickett et al. .......... 428/402 |
| 2010/0283034 A1* | 11/2010 | Qu .......... 257/13 |
| 2011/0017951 A1* | 1/2011 | Ryowa .......... 252/301.16 |

FOREIGN PATENT DOCUMENTS

| | | |
|---|---|---|
| JP | 2011-530187 A | 12/2011 |
| JP | 2012-515803 A | 7/2012 |
| KR | 1020070120346 A | 12/2007 |
| KR | 10-2008-0032785 A | 4/2008 |
| KR | 1020080030555 A | 4/2008 |
| KR | 10-2009-0045575 A | 5/2009 |

OTHER PUBLICATIONS

Sheng et al., "In-Situ Encapsulation of Quantum Dots into Polymer Micropheres", Langmuir, 22, 2006, pp. 3782-3790.
Smith et al., "Nanocrystal Synthesis in an Amphibious Bath: Spontaneous Generation of Hydrophilic and Hydrophobic Surface Coatings**", Angew. Chem. Int. Ed., vol. 47, 2008, pp. 9916-9921.
Korean Office Action for Korean Patent Application No. 10-2009-0096480 dated Aug. 27, 2015.

* cited by examiner

NANOPARTICLE COMPLEX, METHOD OF MANUFACTURING THE SAME, AND DEVICE INCLUDING THE NANOPARTICLE COMPLEX

CROSS-REFERENCE TO RELATED APPLICATION

This application claims priority to Korean Patent Application No. 10-2009-0096480, filed on Oct. 9, 2009, and all the benefits accruing therefrom under 35 U.S.C. §119, the content of which in its entirety is herein incorporated by reference.

BACKGROUND

1. Field

This disclosure relates to a nanoparticle complex, a method of manufacturing the same, and a device including the nanoparticle complex.

2. Description of the Related Art

Semiconductor nanocrystals, which are also called quantum dots, are crystals of a semiconductor material having a particle size on the nanometer scale and include hundreds to thousands of atoms.

Because the semiconductor nanocrystals are very small, they have a large surface area per unit volume and also exhibit a quantum confinement effect. Accordingly, they have unique physicochemical characteristics that differ from the intrinsic characteristics of a bulk semiconductor material.

In particular, because optoelectronic properties of nanocrystals may be controlled by selecting their size, the semiconductor nanocrystals are being actively researched and utilized in display devices and biotechnology applications.

There has been much research on development of diverse technologies for synthesizing semiconductor nanocrystals having excellent characteristics and applicability to diverse areas by controlling the size, structure, and uniformity thereof.

However, in order to apply the semiconductor nanocrystal to a display device, there remains a need for a semiconductor nanocrystal having improved stability, luminous efficacy, color purity, and lifetime.

SUMMARY

One aspect of this disclosure provides a nanoparticle complex having excellent stability, device efficiency, and lifetime.

Another aspect of this disclosure provides a method of preparing the nanoparticle complex efficiently.

A further aspect of this disclosure provides a light emitting device including the nanoparticle complex.

Still another aspect of this disclosure provides a nanoparticle complex including a semiconductor nanocrystal and metal complex ligand on a surface of the semiconductor nanocrystal.

The metal complex ligand may be represented by the following Chemical Formula 1:

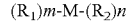

Chemical Formula 1 wherein M is a metal, m+n is the valence of M, and $R_1$ and $R_2$ are the same or different and are independently selected from the group consisting of a substituted or unsubstituted alkyl, a substituted or unsubstituted aryl, a substituted or unsubstituted heteroaryl, a substituted or unsubstituted oxyalkyl, a substituted or unsubstituted oxyaryl, and a combination thereof, optionally wherein a non-adjacent methylene (—$CH_2$—) or a phenylene (—$C_6H_4$—) is substituted with a sulfonyl (—$SO_2$—), carbonyl (CO), ether (—O—), —S—, —S(O)—, or a combination thereof.

According to an aspect of this disclosure, provided is a nanoparticle complex including a nanoparticle and a metal complex ligand on a surface of the nanoparticle, wherein the metal complex ligand includes a cross-linkable functional group at an end of the metal complex ligand.

The nanoparticle may be selected from the group consisting of a semiconductor nanocrystal, a metal particle, a metal oxide particle, and a combination thereof.

The semiconductor nanocrystal may have a concentration gradient in which a concentration of an element of the semiconductor nanocrystal increases in a direction from a center of the semiconductor nanocrystal to an edge of the semiconductor nanocrystal; or the semiconductor nanocrystal may further comprise a core/shell structure in which a concentration of an element of the shell increases in a direction from a core of the semiconductor nanocrystal to an edge of the semiconductor nanocrystal.

The semiconductor nanocrystal may include a compound selected from the group consisting of a Group II-VI compound, a Group III-V compound, a Group IV-VI compound, a Group IV compound, and a combination thereof. The Group II-VI compound may include a binary compound selected from the group consisting of CdSe, CdTe, ZnS, ZnSe, ZnTe, ZnO, HgS, HgSe, HgTe, MgSe, MgS, and a combination thereof; a ternary element compound selected from the group consisting of CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; or a quaternary element compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof. The Group III-V compound may include a binary compound selected from the group consisting of GaN, GaP, GaAs, GaSb, AlN, AlP, AlAs, AlSb, InN, InP, InAs, InSb, and a combination thereof; a ternary element compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof; or a quaternary element compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group IV-VI compound may include a binary compound selected from the group consisting of SnS, SnSe, SnTe, PbS, PbSe, PbTe, and a combination thereof; a ternary element compound selected from the group consisting of SnSeS, SnSeTe, SnSTe, PbSeS, PbSeTe, PbSTe, SnPbS, SnPbSe, SnPbTe, and a combination thereof; or a quaternary element compound selected from the group consisting of SnPbSSe, SnPbSeTe, SnPbSTe, and a combination thereof. The Group IV compound may include a single-element compound selected from the group consisting of silicon (Si), germanium (Ge), and a combination thereof; or a binary compound selected from the group consisting of SiC, SiGe, and a combination thereof.

The metal particle may be selected from the group consisting of palladium (Pd), platinum (Pt), nickel (Ni), cobalt (Co), Rhodium (Rh), iridium (Ir), iron (Fe), rubidium (Ru), gold (Au), silver (Ag), copper (Cu), and a combination thereof.

The metal oxide particle may include a metal oxide selected from the group consisting of silicon (Si), titanium (Ti), cobalt (Co), tin (Sn), aluminum (Al), zinc (Zn), indium (In), zirconium (Zr), nickel (Ni), hafnium (Hf), vanadium (V), and a combination thereof.

The metal complex ligand may be represented by the following Chemical Formula 2:

$$(X_1\text{-}L_1)m\text{-}M\text{-}(L_2\text{-}X_2)n \qquad \text{Chemical Formula 2}$$

wherein M is a metal, m+n is the valence of M, $L_1$ and $L_2$ are the same or different and are independently selected from the group consisting of a substituted or unsubstituted alkylene, a substituted or unsubstituted arylene, a substituted or unsubstituted heteroarylene, a substituted or unsubstituted alkylene oxide, a substituted or unsubstituted arylene oxide, and a combination thereof, optionally wherein a non-adjacent methylene (—$CH_2$—) or a phenylene (—$C_6H_4$—) included therein is substituted with sulfonyl (—$SO_2$—), carbonyl (CO), ether (—O—), —S—, —S(O)—, or a combination thereof, and $X_1$ and $X_2$ are the same or different, and are selected from the group consisting of a substituted or unsubstituted alkyl, a substituted or unsubstituted aryl, a substituted or unsubstituted heteroaryl, a substituted or unsubstituted oxyalkyl, a substituted or unsubstituted oxyaryl, a substituted or unsubstituted alkenyl, a substituted or unsubstituted alkynyl, an unsaturated aromatic group, halogen, —ROR' wherein R is a substituted or unsubstituted alkylene, and R' is hydrogen or an alkyl, an acyl halide of the formula —RCOX wherein R is a substituted or unsubstituted alkylene, and X is a halogen, —RCOOR' wherein R is a substituted or unsubstituted alkylene and R' is hydrogen or an alkyl, an amide, an amine, an imine, an imide, an isocyanate, a (meth)acrylate, a thiol, a phosphine, a phosphine oxide, —$SO_3H$, —$NO_2$, and a combination thereof, and at least one of $X_1$ and $X_2$ is selected from the group consisting of a substituted or unsubstituted alkenyl, a substituted or unsubstituted alkynyl, an unsaturated aromatic group, a halogen, —ROR' wherein R is a substituted or unsubstituted alkylene and R' is hydrogen or an alkyl, an acyl halide of the formula —RCOX wherein R is a substituted or unsubstituted alkylene, and X is a halogen, —RCOOR' wherein R is a substituted or unsubstituted alkylene and R' is hydrogen or an alkyl, an amide, an amine, an imine, an imide, an isocyanate, a (meth)acrylate, a thiol, a phosphine, a phosphine oxide, —$SO_3H$, —$NO_2$, and a combination thereof.

The metal may include an element selected from the group consisting of a Group 2 element, a Group 4 element, or an element of Groups 7 to 13, and a combination thereof. In an embodiment, the metal may be selected from the group consisting of, for example, Zinc (Zn), indium (In), cadmium (Cd), magnesium (Mg), gallium (Ga), titanium (Ti), zirconium (Zr), hafnium (Hf), chromium (Cr), manganese (Mn), iron (Fe), cobalt (Co), nickel (Ni), palladium (Pd), platinum (Pt), copper (Cu), silver (Ag), gold (Au), and a combination thereof.

Also disclosed is a nanoparticle complex, including a nanoparticle; and a metal complex ligand on the surface of the nanoparticle, wherein a first ligand of the metal complex ligand is connected to a second ligand of the same or another metal complex ligand by a bond derived from at least one cross-linkable functional group, or the first ligand and the second ligand are connected through a functional group derived from a polymerizable monomer having a functional group which forms a bond with the cross-linkable functional group. The nanoparticle complex may further include a polymer shell including a polymer, wherein the polymer shell contacts the metal complex ligand.

The polymer shell may include a polymer which is a product of a polymerizable monomer having a reactive functional group selected from the group consisting of a substituted or unsubstituted alkenyl, a substituted or unsubstituted alkynyl, an unsaturated aromatic group, a halogen, —ROR' wherein R is a substituted or unsubstituted alkylene and R' is hydrogen or an alkyl, an acyl halide of the formula —RCOX wherein R is a substituted or unsubstituted alkylene and X is a halogen, —RCOOR' wherein R is a substituted or unsubstituted alkylene and R' is hydrogen or an alkyl, an amide, an amine, an imine, an imide, an isocyanate, a (meth)acrylate, a thiol, a phosphine, a phosphine oxide, —$SO_3H$, —$NO_2$, and a combination thereof, or a product of a polymer including at least one of the foregoing reactive functional groups.

The polymer may be bonded to at least one ligand of the metal complex ligand.

Another aspect of this disclosure provides a method of manufacturing a nanoparticle complex including: synthesizing a nanoparticle, binding a surface of the nanoparticle with a metal complex ligand to form a bound nanoparticle, and adding the bound nanoparticle a combination including a polymerizable monomer or a polymer including a reactive functional group to form a polymer shell on the bound nanoparticle to form the nanoparticle complex.

The polymerizable monomer having a reactive functional group may include a functional group selected from the group consisting of a substituted or unsubstituted alkenyl, a substituted or unsubstituted alkynyl, an unsaturated aromatic group, a halogen, —ROR' wherein R is a substituted or unsubstituted alkylene and R' is hydrogen or an alkyl, an acyl halide of the formula —RCOX wherein R is a substituted or unsubstituted alkylene, and X is a halogen, —RCOOR' wherein R is a substituted or unsubstituted alkylene and R' is hydrogen or an alkyl, an amide, an amine, an imine, an imide, an isocyanate, a (meth)acrylate, a thiol, —$SO_3H$, —$NO_2$, and a combination thereof.

The synthesizing, binding, and adding may be performed in situ.

Still another aspect of this disclosure provides a device including the nanoparticle complex.

Also disclosed is a nanoparticle complex, including: a semiconductor nanoparticle including a core and a shell, wherein the core includes InP and the shell includes ZnS or ZnSeS; a metal complex ligand on the semiconductor nanoparticle, the metal complex ligand including zinc and a ligand derived from undecelyenate; a polymer shell contacting the metal complex ligand, the polymer shell including a polymerization product of ethylene glycol dimethacrylate, wherein the zinc is bonded to a first end of the ligand and the polymer shell is bonded to a second end of the ligand.

Other aspects, features, and advantages of this disclosure will be further described in the following detailed description.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other aspects, advantages and features of this disclosure will become more apparent by describing in further detail exemplary embodiments thereof with reference to the accompanying drawings, in which.

DETAILED DESCRIPTION

Figure 1:
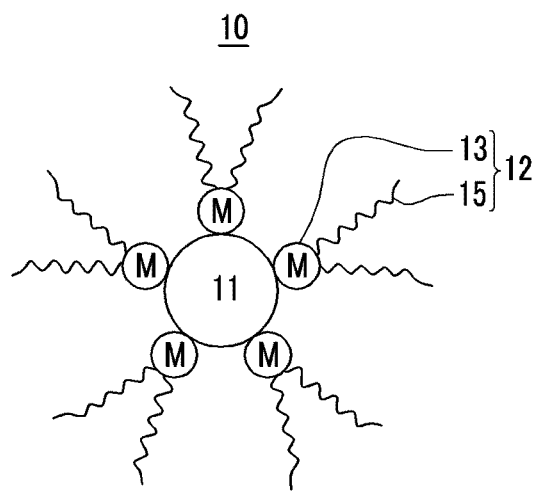
FIGS. 1 to 4 show schematic views of exemplary embodiments of nanoparticle complexes according to various embodiments.

This disclosure will be described more fully hereinafter in the following detailed description of this disclosure, in which some but not all embodiments of this disclosure are described. This disclosure may be embodied in many different forms and is not be construed as limited to the embodiments set forth herein; rather, these embodiments are provided so that this disclosure will be thorough and complete, and will fully convey the scope of the invention to those skilled in the art. Like reference numerals refer to like elements throughout.

In the drawings, the thickness of layers, films, panels, regions, etc., are exaggerated for clarity.

It will be understood that when an element such as a layer, a film, a region, or a substrate is referred to as being "on" another element, it may be directly on the other element or intervening elements may also be present. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, unless otherwise provided, the term "substituted" refers to a compound or radical substituted with at least one (e.g., 1, 2, 3, 4, 5, 6, or more) substituents independently selected from the group consisting of a C1 to C18 linear or branched alkyl, a C6 to C18 aryl, a halogen (e.g., F, Cl, Br, I), and a combination thereof.

As used herein, unless otherwise provided, the term "alkylene" refers to a C1 to C18 alkylene, the term "arylene" refers to a C6 to C24 arylene, the term "heteroarylene" refers to a C6 to C24 heteroarylene including 1 to 3 heteroatoms selected from the group consisting of N, O, S, and P, the term "alkenyl" refers to a C2 to C18 alkenyl, the term "alkynyl" refers to a C2 to C18 alkynyl, and the term "aromatic group" refers to a C6 to C24 aryl or a C2 to C24 heteroaryl.

As used herein, unless otherwise provided, the term "combination thereof" refers to a combination, a stack, a composite, or an alloy of the constituting components.

In the present specification, (meth)acrylate refers to acrylate and methacrylate.

According to an embodiment, a nanoparticle complex includes a semiconductor nanocrystal and a metal complex ligand on the surface of the semiconductor nanocrystal.

The semiconductor nanocrystal may include a compound selected from the group consisting of a Group II-VI compound, a Group III-V compound, a Group IV-VI compound, a Group IV compound, and a combination thereof.

The Group II-VI compound includes at least one of a binary compound selected from the group consisting of CdSe, CdTe, ZnS, ZnSe, ZnTe, ZnO, HgS, HgSe, HgTe, MgSe, MgS, and a combination thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; or a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof. The Group III-V compound includes at least one of a binary compound selected from the group consisting of GaN, GaP, GaAs, GaSb, AlN, AlP, AlAs, AlSb, InN, InP, InAs, InSb, and a combination thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof; or a quaternary element compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group IV-VI compound includes at least one of a binary compound selected from the group consisting of SnS, SnSe, SnTe, PbS, PbSe, PbTe, and a combination thereof; a ternary compound selected from the group consisting of SnSeS, SnSeTe, SnSTe, PbSeS, PbSeTe, PbSTe, SnPbS, SnPbSe, SnPbTe, and a combination thereof; or a quaternary compound selected from the group consisting of SnPbSSe, SnPbSeTe, SnPbSTe, and a combination thereof. The Group IV compound includes at least one of an element selected from the group consisting of Si, Ge, and a combination thereof; or a binary compound selected from the group consisting of SiC, SiGe, and a combination thereof.

In an embodiment a semiconductor nanocrystal may have a substantially uniform concentration of the binary compound, the ternary compound, or the quaternary compound. In another embodiment a semiconductor nanocrystal may have a substantially non-uniform concentration of the binary compound, the ternary compound, or the quaternary compound. In another embodiment, the concentration of the binary compound, the ternary compound, or the quaternary compound may form a concentration gradient in which a concentration of an element of the semiconductor nanocrystal increases in a direction from a center of the semiconductor nanocrystal to an edge of the semiconductor nanocrystal. In another embodiment, the semiconductor nanocrystal may comprise different concentration distributions in the same particle. In addition, the semiconductor nanocrystal may further comprise a core/shell structure in which a semiconductor nanocrystal is surrounded by another semiconductor nanocrystal. The core and shell may have an interface therebetween.

In an embodiment an element in the shell may form a concentration gradient which varies in a direction from the center of the core to an edge of the shell. In another embodiment, a concentration of an element of the shell increases from an interface of the shell and the core to an edge of the shell.

The semiconductor nanocrystal may have an average largest particle diameter of about 1 nanometer (nm) to about 100 nm, specifically 1 nm to about 50 nm, more specifically about 1 nm to about 10 nm.

In addition, the semiconductor nanocrystal may have any shape, and may be a spherical, pyramidal, multi-arm, or a cubic nanoparticle, or may be a nanotube, nanowire, nanofiber, or nanoplate particle, or the like.

In addition, a method of synthesizing the semiconductor nanocrystal according to an embodiment is not restricted, and may include a method known in the related art, which would be known to one skilled in the art without undue experimentation. For example, the method of synthesizing the semiconductor nanocrystal may include the following method. This method of preparing a semiconductor nanocrystal is not limited to the following, but may further include any available art.

For example, a wet chemical process may be used to prepare a semiconductor nanocrystal having a size on a nanometer scale, or to a plurality of semiconductor nanocrystals having several particle sizes or a distribution of size. A semiconductor nanocrystal may be nucleated and grown by adding a precursor material to an organic solvent. When the semiconductor nanocrystal grows, the organic solvent, or an organic ligand present therein, contacts the surface of the semiconductor nanocrystal and controls the growth of the semiconductor nanocrystal.

In addition, a nanoparticle complex may include the semiconductor nanocrystal and an organic ligand on a surface of the semiconductor nanocrystal. The nanoparticle complex may be utilized in various fields, for example by combining the nanoparticle complex with other materials, such as combining the nanoparticle complex with various connecting materials, or removing the organic ligand and substituting other ligands. When the organic ligand is removed during these processes, a structure of a metal or a non-metal element on the surface of the semiconductor nanocrystal may also change or the metal or a non-metal element may be exchanged for another metal or a non-metal element. In addition, the loss of the organic ligand may expose semiconductor nanocrystals to one another and allow them to agglomerate together.

Accordingly, a nanoparticle complex according to an embodiment includes a metal complex ligand binding the surface of a semiconductor nanocrystal. An exemplary embodiment of the nanoparticle complex is shown in FIG. 1. FIG. 1 is a schematic drawing showing an exemplary embodiment of a nanoparticle complex 10. A metal complex ligand 12 includes a metal 13 and a ligand 15, and is represented by the following Chemical Formula 1.

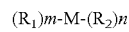

$(R_1)m\text{-}M\text{-}(R_2)n$  Chemical Formula 1

In the above Chemical Formula 1, M is a metal, m+n is the valence of M, and $R_1$ and $R_2$ are each a ligand 15 and $R_1$ and $R_2$ are the same or different and are independently selected from the group consisting of a substituted or unsubstituted alkyl, a substituted or unsubstituted aryl, a substituted or unsubstituted heteroaryl, a substituted or unsubstituted oxyalkyl, a substituted or unsubstituted oxyaryl, and a combination thereof, optionally wherein a non-adjacent methylene (—$CH_2$—) or a phenylene (—$C_6H_4$—) is replaced with a sulfonyl (—SO$_2$—), carbonyl (CO), ether (—O—), —S—, —S(O)—, or a combination thereof.

The metal 13 of the metal complex ligand may be selected from the group consisting of a Group 2 element, a Group 4 element, a Group 7 to 13 element, and a combination thereof, wherein Group refers to a group of the periodic table. In an embodiment the metal may be, for example, zinc (Zn), indium (In), cadmium (Cd), magnesium (Mg), gallium (Ga), titanium (Ti), zirconium (Zr), hafnium (Hf), chromium (Cr), manganese (Mn), iron (Fe), cobalt (Co), nickel (Ni), palladium (Pd), platinum (Pt), copper (Cu), silver (Ag), gold (Au), or a combination comprising at least one of the foregoing. The metal of the metal complex ligand may be the same as a metal of the semiconductor nanocrystal, or may be of a same periodic group as a periodic group of a metal of the semiconductor nanocrystal. When the semiconductor nanocrystal has a core-shell structure, the metal of the metal complex ligand may be the same as a metal of the shell or may be of a same periodic group as a periodic group of a metal of the shell.

As shown in FIG. 1, the metal 13 of the metal complex ligand 12 is combined (e.g., disposed) on the surface of the semiconductor nanocrystal 11.

The metal complex ligand 12 may have a similar structure and may have chemical properties which are similar to an organic ligand disposed on the semiconductor nanocrystal 11, which may be prepared through a wet synthesis process, and thus has an excellent accessibility and miscibility thereto.

The metal complex ligand 12 may cover (e.g., bind) about 5 percent (%) to 100%, specifically about 10% to about 95%, more specifically greater than about 5% of the entire surface area of the semiconductor nanocrystal 11. The metal complex ligand 12 may be included in an amount of about 1 to about 5 moles, based on 1 mole of the semiconductor nanocrystal 11. In another embodiment, the metal complex ligand 12 may be included in an amount of about 0.1 to about 10 moles, more specifically about 2 to about 8 moles, based on 1 mole of the semiconductor nanocrystal 11. When metal complex ligand 12 is included within the foregoing range, it may sufficiently passivate the semiconductor nanocrystal 11.

The nanoparticle complex 10 may further include an organic ligand which is distinct from and in addition to the ligand 15 and which may be associated with the metal complex ligand or bound to the metal. The organic ligand may be an organic solvent, an organic ligand introduced during synthesis of a semiconductor nanocrystal, or an organic ligand substituted after the synthesis of the semiconductor nanocrystal.

According to another embodiment, provided is a nanoparticle complex including a nanoparticle and a metal complex ligand on the surface thereof, wherein the metal complex ligand includes a cross-linkable functional group. In an embodiment the cross-linkable group may be at a terminal end of the metal complex ligand, in which the terminal end is an end of the ligand opposite to an end of the ligand binding the metal.

The nanoparticle may include a semiconductor nanocrystal, a metal particle, a metal oxide particle, or a combination thereof. In an embodiment, the semiconductor nanocrystal may be the same as described above.

The metal particle may include a metal selected from the group consisting of palladium (Pd), platinum (Pt), nickel (Ni), cobalt (Co), Rhodium (Rh), iridium (Ir), iron (Fe), rubidium (Ru), gold (Au), silver (Ag), copper (Cu), and a combination thereof. The metal particle may be an alloy of two or more metals, or may have a core/shell structure. In an embodiment, the metal particle comprises a concentration gradient in which a concentration of a metal of the metal particle increases in a direction from the center of the metal particle to the edge of the metal particle. In another embodiment, the metal particle further comprises a core/shell structure, and the core/shell structure has a concentration gradient at an interface between the core and the shell, in which a concentration of a metal of the shell increases in a direction from the center of the metal particle to the edge of the metal particle. In an embodiment, the concentration of a metal of the shell increases from an interface between the core and the shell to an edge of the shell.

The metal oxide particle is an oxide of a metal selected from the group consisting of silicon (Si), titanium (Ti), cobalt (Co), tin (Sn), aluminum (Al), zinc (Zn), indium (In), zirconium (Zr), nickel (Ni), hafnium (Hf), vanadium (V), and a combination thereof.

In addition, the nanoparticle may have an average largest particle diameter ranging from about 1 nanometer (nm) to about 100 nm, specifically about 5 nm to about 90 nm, more specifically about 10 nm to about 80 nm, and in an embodiment the nanoparticle may have an average largest diameter of about 1 nm to about 10 nm.

In addition, the nanoparticle may have any shape and may be a spherical, pyramidal, multi-arm, or cubic, and may be a nanoparticle, nanotube, nanowire, nanofiber, or nanoplate particle, or the like.

In addition, the nanoparticle may be prepared using a synthesis method provided in a related field, and may be included in all technologies with no particular limit.

Figure 2:
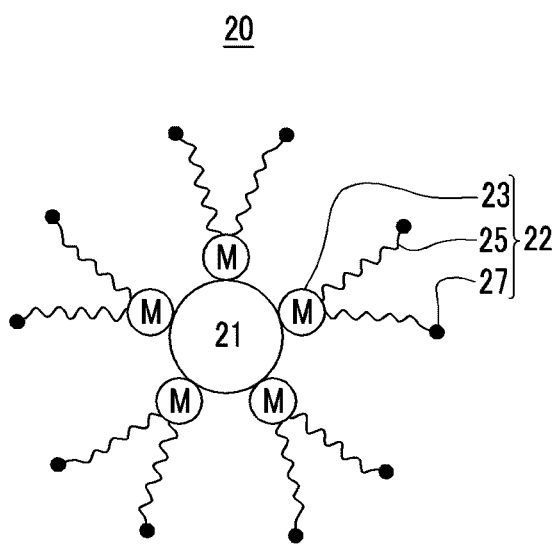

FIG. 2 is a drawing schematically showing the nanoparticle complex 20. As shown in FIG. 2, the nanoparticle 21 is bound with a metal complex ligand 22 on the surface thereof. The metal complex ligand 22 may include a metal 23, a ligand 25, and a cross-linkable functional group 27, and may be represented by the following Chemical Formula 2.

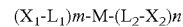

(X$_1$-L$_1$)$m$-M-(L$_2$-X$_2$)$n$          Chemical Formula 2

In the above Chemical Formula 2, M is a metal, m+n is the valence of M, L$_1$ and L$_2$ are the same or different and are independently selected from the group consisting of a substituted or unsubstituted alkylene, a substituted or unsubstituted arylene, a substituted or unsubstituted heteroarylene, a substituted or unsubstituted alkylene oxide, a substituted or unsubstituted arylene oxide, and a combination thereof, optionally wherein a non-adjacent methylene (—CH$_2$—) or a phenylene (—C$_6$H$_4$—) is substituted with sulfonyl (—SO$_2$—), carbonyl (CO), ether (—O—), —S—, —S(O)—, or a combination thereof, and X$_1$ and X$_2$ are each independently a cross-linkable functional group 27 that can be the same or different and are selected from the group consisting of a substituted or unsubstituted alkyl, a substituted or unsubstituted aryl, a substituted or unsubstituted heteroaryl, a substituted or unsubstituted oxyalkyl, a substituted or unsubstituted oxyaryl, a substituted or unsubstituted alkenyl, a substituted or unsubstituted alkynyl, a unsaturated aromatic group including a double bond or a triple bond, a halogen, —ROR' wherein R is a substituted or unsubstituted alkylene and R' is hydrogen or an alkyl, an acyl halide of the formula —RCOX wherein R is a substituted or unsubstituted alkylene and X is a halogen, —RCOOR' wherein R is a substituted or unsubstituted alkylene and R' is hydrogen or an alkyl, an amide, an amine, an imine, an imide, an isocyanate, a (meth) acrylate, a thiol, a phosphine, a phosphine oxide, —SO$_3$H, —NO$_2$, and a combination thereof. At least one of X$_1$ and X$_2$ is a substituted or unsubstituted alkenyl, a substituted or unsubstituted alkynyl, an unsaturated aromatic group, a halogen, —ROR' wherein R is a substituted or unsubstituted alkylene and R' is hydrogen or an alkyl, an acyl halide of the formula —RCOX wherein R is a substituted or unsubstituted alkylene, and X is a halogen, —RCOOR' wherein R is a substituted or unsubstituted alkylene and R' is hydrogen or an alkyl, an amide, an amine, an imine, an imide, an isocyanate, a (meth)acrylate, a thiol, a phosphine, a phosphine oxide, —$SO_3H$, —$NO_2$, and a combination thereof.

Each ligand 25 may have a different cross-linkable functional group, such as $X_1$ or $X_2$, and the cross-linkable functional group may be capable of being bound to a neighboring or other functional group. In addition, the cross-linkable functional groups may be connected with each other through a monomer having a reactive functional group differing from but reactive with the cross-linkable functional groups $X_1$ and $X_2$. The reactive functional group may be selected by one skilled in the art without undue experimentation.

The metal 23 may be selected from the group consisting of a Group 2 element, a Group 4 element, or a Group 7 to 13 element, and a combination thereof, wherein Group refers to a group of the periodic table. In an embodiment the metal may be selected from the group consisting of, for example, zinc (Zn), indium (In), cadmium (Cd), magnesium (Mg), gallium (Ga), titanium (Ti), zirconium (Zr), hafnium (Hf), chromium (Cr), manganese (Mn), iron (Fe), cobalt (Co), nickel (Ni), palladium (Pd), platinum (Pt), copper (Cu), silver (Ag), gold (Au), and a combination thereof.

As shown in FIG. 2, the nanoparticle 21 is combined with a metal 23 of a metal complex ligand 22 on the surface of the nanoparticle.

When the metal complex ligand 22 has a similar structure to an organic ligand of the nanoparticle 21 prepared in a wet synthesis method, the presence of the metal complex ligand imparts excellent contacting properties and miscibility to the nanoparticle 21.

The nanoparticle complexes 10 and 20 may further include a polymer shell surrounding the metal complex ligand. The nanoparticle complexes including a polymer shell are illustrated in FIGS. 3 and 4.

Figure 3:
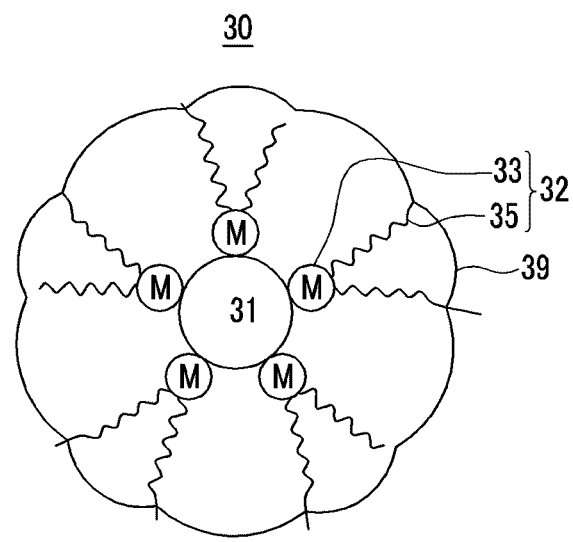
Figure 4:
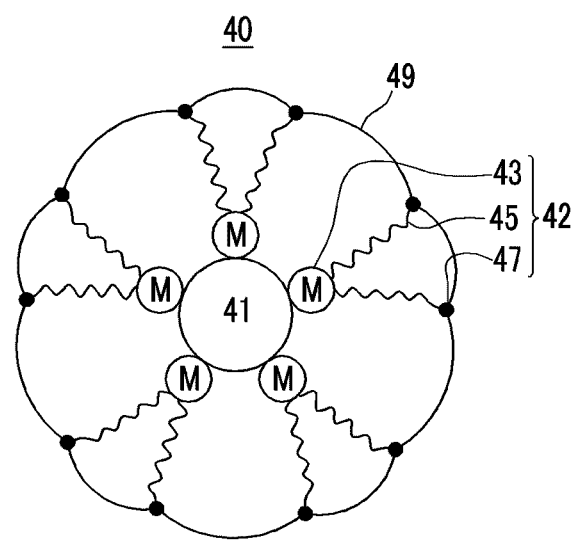

As shown in FIG. 3, a nanoparticle complex 30 includes a metal complex ligand 32 on the surface of a nanoparticle 31 and a polymer shell 39 surrounding the metal complex ligand 32.

The nanoparticle 31 may include a semiconductor nanocrystal, a metal particle, a metal oxide particle, or a combination thereof. The nanoparticle 31 may be the same as the nanoparticle 21 described above.

The metal complex ligand 32 includes a metal 33 and a ligand 35, and is represented by the above Chemical Formula 1.

The metal complex ligand 32 may cover (e.g., bind) about 5% to 100%, specifically about 10% to about 95%, more specifically greater than about 5% of the entire surface area of the nanoparticle 31. The metal complex ligand 32 may be included in an amount of about 0.1 moles to about 10 moles, based on 1 mole of the nanoparticle 31. In another embodiment, the metal complex ligand 32 may be included in an amount of about 1 mole to 5 moles, specifically 3 moles, based on 1 mole of the nanoparticles 31. When the metal complex ligand is included within the foregoing range, the nanoparticle 31 may be passivated.

The polymer shell 39 may be prepared by polymerizing a polymerizable monomer or an oligomer which includes a reactive functional group, or by cross-linking a polymer which includes a reactive functional group.

The polymerization of the polymerizable monomer or the oligomer including a reactive functional group, or the cross-linking of the polymer including a reactive functional group may be initiated using a catalyst, heat, ultraviolet ("UV") light, or the like. In an embodiment, a polymerization initiator may be further included.

To form the polymer shell 39, the synthesized nanoparticles 31 may be partially or fully separated from the synthesis mixture in which they are formed, and then combined with a metal complex ligand 32 in a new reaction system (e.g., new reactor and/or container) to form a polymer shell 39. In another embodiment, after synthesizing nanoparticles 31, the combination of the nanoparticles 31 with a metal complex ligand 32 and formation of a polymer shell 39 may be performed in-situ, e.g., in the same reaction filed without one or more isolation steps.

The polymer shell 39 may cover (e.g., contact) about 5% to 100%, specifically about 10% to about 95%, more specifically greater than about 5% of the entire surface area of the nanoparticle 31. The polymer shell 39 may be included in an amount of about 50 to about 1000 parts by weight, specifically about 100 to about 900 parts by weight, more specifically about 150 to about 800 parts by weight, based on 100 parts by weight of a nanoparticle 31. In an embodiment, polymer shell 39 may be included in an amount of about 200 to about 500 parts by weight, based on 100 parts by weight of a nanoparticle 31. When the polymer shell is included within the foregoing range, the polymer shell may sufficiently passivate the nanoparticle 31.

Referring to FIG. 4, a nanoparticle complex 40 includes a nanoparticle 41, a metal complex ligand 42 on the surface thereof, and a polymer shell 49 surrounding (e.g., contacting) the metal complex ligand 42. The metal complex ligand 42 includes a metal 43, a ligand 45, and a cross-link junction 47. The cross-link junction 47 is formed by contacting a monomer or a polymer included in the polymer shell 49 with a cross-linkable functional group of the ligand 45. In other words, the polymer shell 49 may include a polymer prepared by polymerizing a monomer or oligomer including a reactive functional group which is capable of reacting with reactive functional groups $X_1$ and $X_2$ of the metal complex ligand 42 to form a bond. Accordingly, the monomer or oligomer is selected to have a reactive functional group that is capable of reacting with the reactive functional groups $X_1$ and $X_2$ of the metal complex ligand 42. For example, when the metal complex ligand 42 has a halogen as the reactive functional groups $X_1$ and $X_2$, a monomer or oligomer including —ROR' or acyl halide is selected. In another embodiment, the metal complex ligand has a carboxylic acid group as the reactive functional groups $X_1$ and $X_2$, a monomer or oligomer including an amide group or an amine group is selected.

The monomer or oligomer, as shown in FIG. 4, includes two or more reactive sites, for example two or more functional groups and is cross-linked with a ligand 45 of a metal complex ligand 42 to form a stable polymer shell 49. The polymer shell 49 is covalently connected to at least one ligand 45 of the metal complex ligand 42. In addition, the polymer shell 49 may be formed by contacting a polymer including at least one reactive functional site or group with the ligand 45 of the metal complex ligand 42.

The metal complex ligand 42 may cover (e.g., bind) about 5% to 100%, specifically about 10% to about 95%, more specifically greater than about 5% of the entire surface area of the nanoparticle 41. The metal complex ligand may also be included in an amount of about 0.1 to about 10 moles, based on 1 mole of the nanoparticle 41. In another embodiment, the metal complex ligand 32 may be included in an amount of 1 to about 5 moles, specifically 3 moles, based on 1 mole of the nanoparticle 41. When the metal complex ligand is included within the foregoing range, the metal complex ligand may sufficiently passivate the nanoparticle 41.

When the polymer shell 49 is formed through the metal complex ligand 42 as shown in FIGS. 3 and 4, the polymer shell 49 may protect the nanoparticle 41. Thus, damage to the nanoparticle 41 on a surface thereof may be substantially reduced or effectively eliminated and the nanoparticle may be better stabilized or protected than when a polymer is substituted for an existing organic ligand, thus reducing or effectively preventing loss of the existing organic ligand.

The nanoparticle complex may be prepared by binding the surface of a nanoparticle with a metal complex ligand, adding the nanoparticle bound with the metal complex ligand to a reaction solution including a polymerizable monomer, oligomer or polymer including a reactive functional group, and forming a polymer shell.

The polymerization of a polymerizable monomer or an oligomer including a reactive functional group, or the cross-linking of a polymer including a reactive functional group, a chemical reaction of a monomer or oligomer including a reactive functional group, or a chemical reaction of a polymer with a metal complex ligand 42 may be initiated using a catalyst, heat, UV, or the like. In an embodiment, a polymerization initiator may be further included.

In one embodiment the synthesized nanoparticles 41 are fully or partially separated from the reaction system, and then combined with a metal complex ligand 42 in a new reaction system, e.g., a new reactor and/or container, to form a polymer shell 49. In another embodiment, after synthesizing a nanoparticle 41, combination of a metal complex ligand 42 with the nanoparticle 41 and formation of a polymer shell 49 may be performed in-situ (e.g., in the same reaction system without one or more isolation steps).

The polymer shell 49 may cover (e.g., contact) about 5% to 100%, specifically about 10% to about 95%, more specifically greater than about 5% of the entire surface area of a nanoparticle 41. The polymer shell may be included in an amount of about 10 to about 500 parts by weight, specifically about 20 to about 400 parts by weight, more specifically about 40 to about 300 parts by weight, based on 100 parts by weight of a nanoparticle 41. When the polymer shell is included within the foregoing range, it may sufficiently passivate a nanoparticle 41.

The nanoparticle complexes 10, 20, 30, and 40 may be coated with a metal oxide. The metal oxide may include an oxide of a metal selected from the group consisting of silicon (Si), titanium (Ti), cobalt (Co), tin (Sn), aluminum (Al), zinc (Zn), indium (In), zirconium (Zr), nickel (Ni), hafnium (Hf), vanadium (V), and a combination thereof.

The metal oxide may act as a protective layer to protect the surface of the nanoparticle complexes 10, 20, 30, and 40. Each of the nanoparticle complexes 10, 20, 30, and 40 may further include at least one of an organic colloid, an inorganic colloid, an organic polymer, or the like, in addition to or in place of the metal oxide. However, the protective layer is not limited thereto. The protective layer may be formed (e.g., disposed) by absorbance, polymerization, sol-gel reaction, or acid-base reaction of the aforementioned materials on the surface of a nanoparticle complex.

The sol-gel reaction forms a metal oxide by hydrolysis of a metal oxide precursor. The metal oxide precursor may be selected from the group consisting of triethoxysilane, trimethoxysilane, tributoxysilane, sodium silicate, titanium isopropoxide, titanium butoxide, tin butoxide, sodium stannate, cobalt carbonate, aluminum chloride, zinc chloride, indium chloride, zirconium chloride, nickel chloride, hafnium chloride, vanadium chloride, and a combination thereof.

To the hydrolysis, an additive, such as a surfactant, an acid catalyst, or a base catalyst may be further added.

In addition, the nanoparticle complexes 10, 20, 30, or 40, or a combination comprising at least one of the foregoing may be mixed with an organic polymer and applied to a device.

Because the nanoparticle complexes 10, 20, 30, and 40 may have improved stability relative to the nanoparticles 11, 21, 31, and 41, respectively, they may be utilized in various types of devices. For example, they may be used to provide a light emitting diode, a memory device, a laser device, a photoelectric device, an organic photoelectric device, a solar cell, or the like. In addition, a nanoparticle complex including a luminescent nanoparticle may be applied to a physiological field such as in a biotechnology application, or the like.

Figure 5:
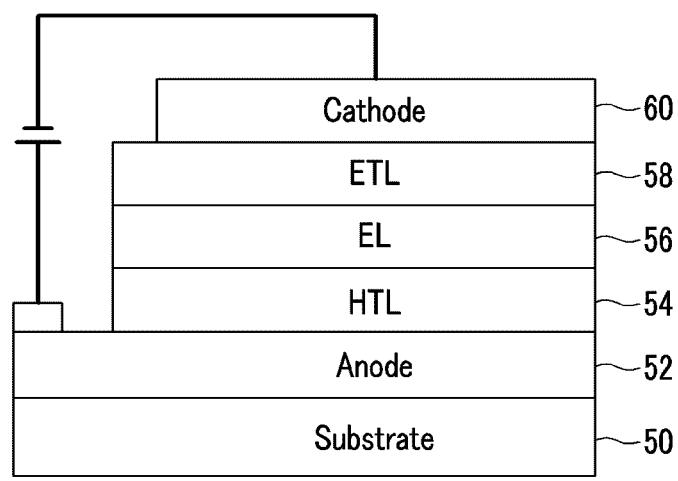
FIG. 5 is a cross-sectional view of an exemplary embodiment of a light emitting device including an exemplary embodiment of a nanoparticle complex.

FIG. 5 illustrates an exemplary embodiment of a current-driven light emitting device including a nanoparticle complex as a light emitting material.

FIG. 5 is a cross-sectional view of an exemplary embodiment of a light emitting device including the nanoparticle complex 10, 20, 30, or 40, or a combination comprising at least one of the foregoing.

The light emitting device may include an electroluminescent device, such as an organic light emitting diode ("OLED"). Generally, an OLED is fabricated by forming an emission layer between two electrodes, and may be operated by injecting an electron and a hole from the each of the two electrodes into the organic emission layer to thereby produce an exciton upon recombination of the electron and the hole. Light is generated when the exciton returns to a ground state from an exited state.

For example, as illustrated in FIG. 5, an OLED display device is disposed on an anode 52 which is on an organic substrate 50. The anode 52 may comprise a material having a high work function to facilitate hole injection. The anode 20 may include indium tin oxide ('ITO") or a transparent oxide of indium oxide. Over the anode 52, a hole transport layer ("HTL") 54, an emission layer ("EL") 56, and an electron transport layer ("ETL") 58 are sequentially disposed. The hole transport layer 54 may include a p-type semiconductor, and the electron transport layer 58 may include an n-type semiconductor or a metal oxide. The emission layer 56 includes the nanoparticle complex 10, 20, 30, or 40, or a combination comprising at least one of the foregoing.

A cathode 60 is disposed on the electron transport layer 58. The cathode 60 may comprise a material having a low work function to facilitate injection of the electrons into the electron transport layer 58. The cathode 60 may include a metal selected from the group consisting of magnesium, calcium, sodium, potassium, titanium, indium, yttrium, lithium, gadolinium, aluminum, silver, tin, lead, cesium, barium, alloys thereof, and a combination thereof. In an embodiment, the cathode 60 may comprise a multi-layered material, such as LiF/Al, $LiO_2$/Al, LiF/Ca, LiF/Al, $BaF_2$/Ca, or a combination comprising at least one of the foregoing, but is not limited thereto. Because a method for fabricating the anode 52, the hole transport layer 54, the emission layer 56, the electron transport layer 58, and the cathode 60 and a method for assembling them are known to those skilled in the art, and thus can be determined without undue experimentation, these methods will not be described in further detail in this specification.

Figure 6:
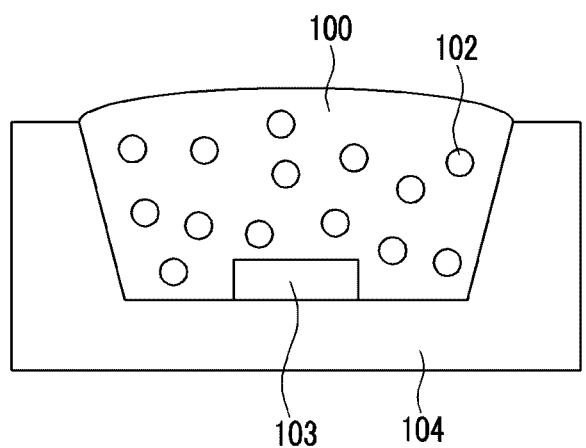
FIG. 6 is a cross-sectional view of an exemplary embodiment of a photo-conversion device.

Hereafter, a light emitting device according to an embodiment will be further disclosed. Referring to FIG. 6, an exemplary embodiment of a photoelectric device including a nanoparticle complex as a light emitting material will be further described as an example of the light emitting device.

FIG. 6 is a cross-sectional view of an exemplary embodiment of a photo-conversion device.

The photo-conversion device includes a substrate 104 comprising silver (Ag), or the like, a light emitting diode chip 103 which can provide blue or ultraviolet ("UV") light, the light emitting diode chip 103 disposed on the substrate 104, and a matrix 100, which includes a nanoparticle complex 102, on the light emitting diode chip 103. The nanoparticle complex 102 may emit red, green, or blue light, and thus may be referred to as a red, green, or blue nanoparticle. The matrix 100 may be an organic material or an inorganic material. The nanoparticle complex 102 is dispersed in the matrix 100, and the matrix may be disposed on (e.g., coat) a recessed portion of the substrate 104 to thereby substantially or entirely cover the light emitting diode chip 103.

The nanoparticle complex 102 may absorb light (e.g. excitation energy) of the light emitting diode chip 103 and emit light having a different wavelength. The nanoparticle complex 102 may have variously-regulated light emitting wavelengths. For example, a white light emitting diode may be fabricated by combining a red emitting nanoparticle complex and a green emitting nanoparticle complex with a blue light emitting diode chip. Alternatively, another white light emitting diode may be fabricated by combining a red emitting nanoparticle complex, a green emitting nanoparticle complex, and a blue emitting nanoparticle complex with an ultraviolet ("UV") light emitting diode chip. A light emitting diode emitting light of various wavelengths may be fabricated by combining nanoparticle complexes emitting light with various wavelengths with a light emitting diode chip.

Hereinafter, the embodiments are illustrated in further detail with reference to examples. However, the following are exemplary embodiments and are not limiting.

Example 1

Synthesis of an InP/ZnS/Zn(Und)$_2$ Nanoparticle Complex

Example 1-1

Synthesis of an InP/ZnS Semiconductor Nanocrystal

A 0.75 millimole (mmol) quantity of In(OAc)$_3$, 2.25 mmol of palmitic acid ("PA"), and 15 milliliters (mL) of 1-octadecene ("ODE") are agitated at 120° C. for 1 hour under vacuum, and 0.375 mmol of tris(trimethylsilyl)phosphine ("TMSP") is added thereto under a nitrogen atmosphere, preparing a first solution. In another flask, 0.6 mmol of In(OAc)$_3$, 1.8 mmol of PA, and 30 mL of ODE are agitated at 120° C. for one hour under vacuum and then heated under a nitrogen atmosphere at 280° C. A 0.3 mmol quantity of TMSP is added to the mixture, and 40 minutes later, 11 mL of the first solution is added thereto in a dropwise fashion. After an additional 30 minutes, the resulting mixture is cooled to room temperature and separated with acetone. The resulting product is dispersed into toluene. Separately, 0.6 mmol of Zn(OAc)$_2$, 1.2 mmol of oleic acid ("OA"), and 20 mL of trioctylamine ('TOA") are heated at 120° C. under vacuum and then at 220° C. under a nitrogen atmosphere. Then, InP is added thereto, and 1.2 mmol of a 0.4 molar (M) sulfur-trioctyl phosphine solution ("S/TOP," a solution prepared by dissolving sulfur in trioctyl phosphine, "TOP") is added thereto in a dropwise fashion. The resulting mixture is heated at 300° C. for one hour. Next, the mixture is cooled to room temperature, separated with ethanol, and dispersed into toluene, providing InP/ZnS semiconductor nanocrystals including an InP core and a ZnS shell surrounding the core (quantum yield ("QY"): 54%).

Example 1-2

Synthesis of an InP/ZnS/Zn(Und)$_2$ Nanoparticle Complex

The InP/ZnS synthesized from Example 1-1 is coated with palmitic acid ("PA"), trioctylphosphine ("TOP"), trioctylamine, and oleic acid. The InP/ZnS is cooled to room temperature, and 1.5 mmol of Zn(undecylenate)$_2$ ("Zn(Und)$_2$") is added thereto. The resulting mixture is heated at 230° C. for one hour. The mixture is then cooled, separated with ethanol, and dispersed into toluene, providing an InP/ZnS/Zn(Und)$_2$ nanoparticle complex including InP/ZnS core/shell semiconductor nanocrystals and Zn(Und)$_2$ surrounding the core (QY: 54%). Based on inductively coupled plasma atomic emission spectroscopy ("ICP-AES", Shimadzu ICPS-8100) analysis, when the amount of InP/ZnS nanocrystals is 1 mol, the Zn(Und)$_2$ metal complex ligand is included in an amount of 1.8 mol. Accordingly, a portion of the Zn(Und)$_2$ is combined with InP/ZnS as a ligand.

Example 2

Synthesis of an InP/ZnSeS/Zn(Und)$_2$ Nanoparticle Complex

Example 2-1

Synthesis of an InP/ZnSeS Semiconductor Nanocrystal

A 0.2 mmol quantity of In(OAc)$_3$, 0.1 mmol of Zn(OAc)$_2$, 0.8 mmol of palmitic acid ("PA"), and 10 mL of 1-octadecene ("ODE") are agitated at 120° C. for one hour under vacuum and cooled to room temperature. Then, 0.2 mmol of tris (trimethylsilyl)phosphine ("TMSP") is added thereto under a nitrogen atmosphere. The resulting product is heated to 320° C. and then cooled to room temperature. It is separated with acetone and dispersed into toluene. Separately, 0.3 mmol of Zn(OAc)$_2$, 0.6 mmol of oleic acid ("OA"), and 10 mL of trioctylamine ("TOA") are heated at 120° C. under vacuum and at 220° C. under a nitrogen atmosphere. Then, InZnP is added thereto, and 0.05 mL of 0.4M Se/TOP is added thereto in a dropwise fashion. The resulting mixture is heated at 280° C. Five minutes later, 0.6 mmol of 0.4 M S/TOP is added thereto. Thirty minutes later, the resulting product is heated to 300° C. and heated for an additional 30 minutes. Then, the resulting product is cooled to room temperature, separated with ethanol, and dispersed into toluene, providing InP/ZnSeS semiconductor nanocrystals including an InP core and ZnSeS shell surrounding the core (quantum yield (QY): 52%).

Example 2-2

Synthesis of an InP/ZnSeS/Zn(Und)$_2$ Nanoparticle Complex

The InP/ZnSeS according to Example 2-1 is surrounded with palmitic acid ("PA"), trioctylphosphine ("TOP"), trioctylamine, and oleic acid on the surface. The resulting composition is cooled to room temperature, and 1.5 mmol of Zn(Und)$_2$ is added thereto. The resulting product is heated at 230° C. for one hour. Then, the product is cooled, separated with ethanol, and dispersed into toluene, providing an InP/ZnSeS/Zn(Und)$_2$ nanoparticle complex including an InP/ZnSeS core/shell semiconductor nanocrystal and Zn(Und)$_2$ surrounding the InP/ZnSeS core/shell semiconductor nanocrystal (QY: 50%).

Example 3

Synthesis of an InP/ZnS/Zn(Und)$_2$-EGMA Nanoparticle Complex

The InP/ZnS/Zn(Und)$_2$ prepared according to Example 1 is cooled to room temperature, and 0.015 grams (g) of azobisisobutyronitrile ("AIBN") and 2.25 mmol of ethylene glycol dimethacrylate ("EGMA") are added thereto. The resulting mixture is heated at 80° C. for 10 minutes, polymerizing the EGMA. The polymerized product is cooled, washed with ethanol and hexane, and filtered to obtain a pink powder. The powder is nanoparticle complex including Zn(Und)$_2$ surrounding an InP/ZnS core/shell nanocrystal and having a polymer shell comprising the reaction product of a vinyl group of undecylenate of the Zn(Und)$_2$ and an EGMA monomer (hereinafter referred to as InP/ZnS/Zn(Und)$_2$-EGMA). TGA analysis provided that the polymer shell is 360 parts by weight, based on 100 parts by weight of InP/ZnS nanocrystals.

Example 4

Synthesis of an InP/ZnSeS/Zn(Und)$_2$-EGMA Nanoparticle Complex

The InP/ZnSeS/Zn(Und)$_2$ synthesized according to Example 2 is cooled to room temperature, and 0.015 g of azobisisobutyronitrile ("AIBN") and 2.25 mmol of ethylene glycol dimethacrylate ("EGMA") are added thereto. The resulting mixture is heated at 80° C. for 10 minutes to polymerize the EGMA. The resulting product is cooled and then washed with ethanol and hexane and filtered to obtain a yellow-green powder. The powder is a nanoparticle complex including Zn(Und)$_2$ surrounding the InP/ZnSeS core/shell nanocrystal and having a polymer shell comprising the reaction product of a vinyl group of undecylenate of the Zn(Und)$_2$ with an EGMA monomer (hereinafter referred to as InP/ZnSeS/Zn(Und)$_2$-EGMA).

Comparative Example 1

Synthesis of a Nanoparticle Complex not including Zn(Und)$_2$

The InP/ZnS prepared according to Example 1-1 is cooled to room temperature, and 0.015 g of AIBN and 2.25 mmol of EGMA are added thereto. The resulting mixture is heated at 80° C. for 10 minutes. The resulting product is washed with ethanol and hexane and separated, obtaining a small amount of a white powder.

Figure 7:
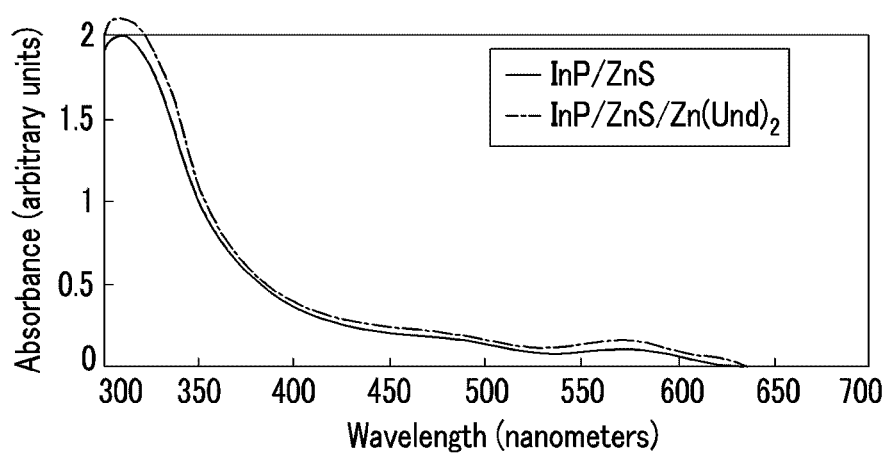
FIG. 7 is a graph of absorbance (arbitrary units, a.u.) versus wavelength (nanometers, m) showing UV absorbance of InP/ZnS according to Example 1-1 and InP/ZnS/Zn(Und)$_2$ according to Example 1-2.
Figure 8:
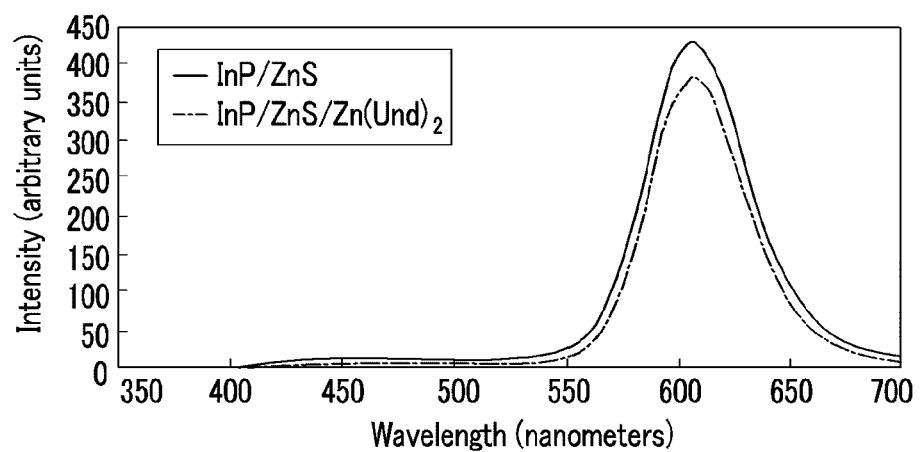
FIG. 8 is a graph of intensity (arbitrary units, a.u.) versus wavelength (nanometers) showing photoluminescence ("PL") strength of InP/ZnS according to Example 1-1 and InP/ZnS/Zn(Und)$_2$ according to Example 1-2.

FIG. 7 shows UV absorption spectra of the InP/ZnS of Example 1-1 and the InP/ZnS/Zn(Und)$_2$ of Example 1-2. As shown in FIG. 7, the InP/ZnS and the InP/ZnS/Zn(Und)$_2$ absorb UV light around 568 nm. The photoluminescence ("PL") strength of these materials is shown in FIG. 8. As shown in FIG. 8, the InP/ZnS has a maximum light emitting wavelength of 606 nm and full-width-half-maximum ("FWHM") of 52 nm. In addition, the InP/ZnS/Zn(Und)$_2$ has a maximum light emitting wavelength at 607 nm and FWHM of 53 nm. As shown in FIGS. 7 and 8, even though the Zn(Und)$_2$, a metal complex ligand, surrounds InP/ZnS, it does not influence its optical characteristics.

Figure 9:
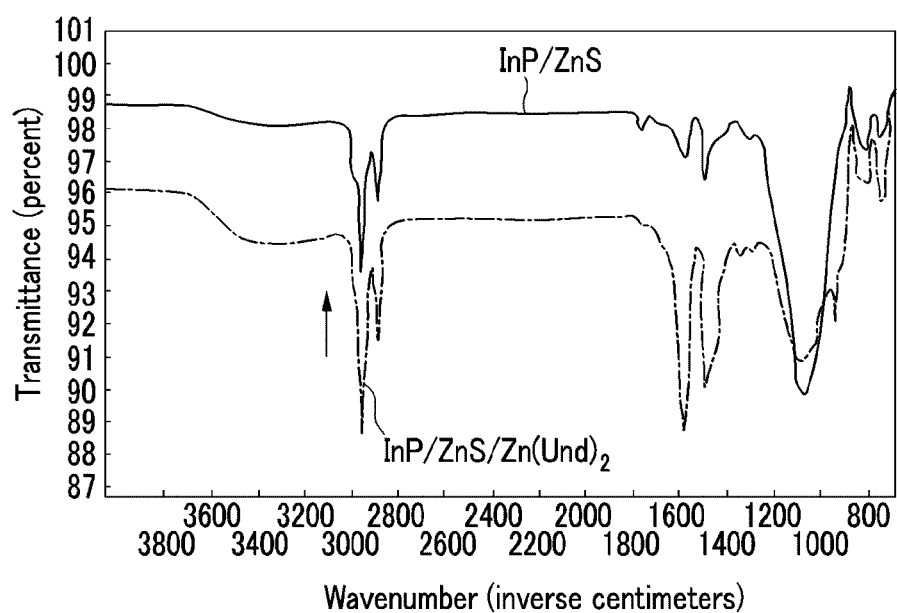
FIG. 9 is a graph of transmittance (percent, %) versus wavenumber (inverse centimeters, cm$^{-1}$) showing infrared ("IR") spectra of InP/ZnS according to Example 1-1 and InP/ZnS/Zn(Und)$_2$ according to Example 1-2.

FIG. 9 shows infrared ("IR") spectra of the InP/ZnS according to Example 1-1 and the InP/ZnS/Zn(Und)$_2$ according to Example 1-2. Referring to FIG. 9, the IR spectrum of the InP/ZnS/Zn(Und)$_2$ according to Example 1-2 has an increased carboxylate band between 1400 to 1600 inverse centimeters (cm$^{-1}$) and another band around 3000 to 3100 cm$^{-1}$, which can be assigned to a terminal vinyl group. Accordingly, the InP/ZnS/Zn(Und)$_2$ of Example 1-2 increasingly includes carboxylate and a vinyl group at its terminal end due to the Zn(Und)$_2$ when compared with the InP/ZnS of Example 1-1.

Figure 10:
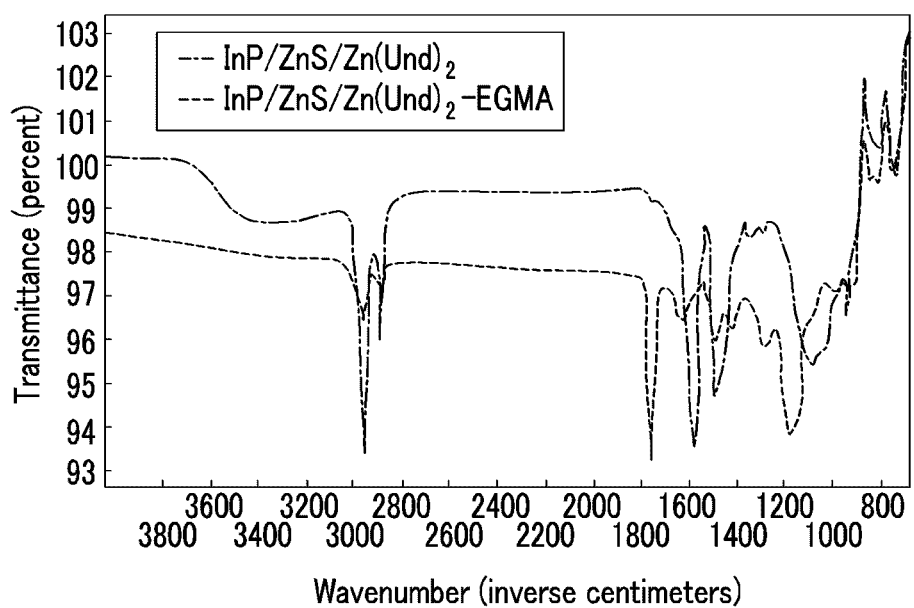
FIG. 10 is a graph of transmittance (percent, %) versus wavenumber (inverse centimeters, cm$^{-1}$) showing IR spectra of InP/ZnS/Zn(Und)$_2$ according to Example 1-2 and InP/ZnS/Zn(Und)$_2$-EGMA according to Example 3.

FIG. 10 shows IR spectra of the InP/ZnS/Zn(Und)$_2$ according to Example 1-2 and the InP/ZnS/Zn(Und)$_2$-EGMA according to Example 3 to identify a polymer shell. In FIG. 10, the InP/ZnS/Zn(Und)$_2$-EGMA has a large acryl band between 1700 to 1800 cm$^{-1}$ and 1100 to 1200 cm$^{-1}$ due to the EGMA.

Figure 11:
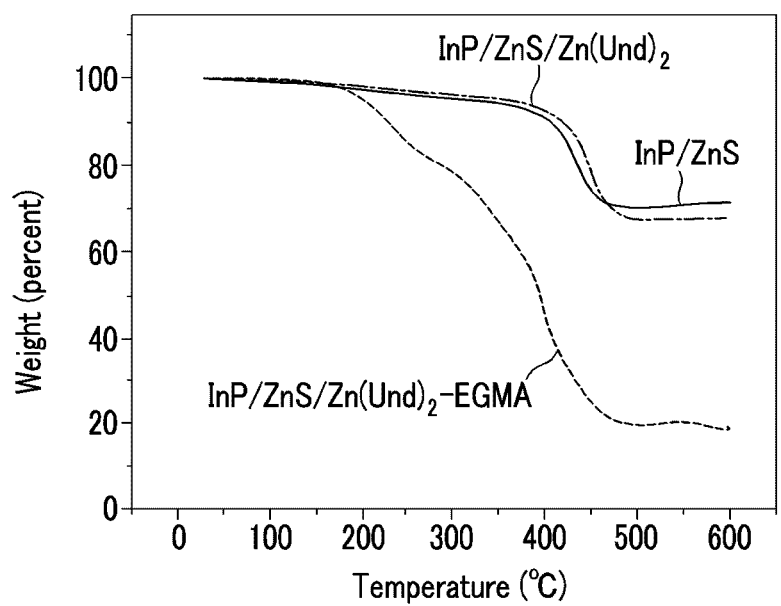
FIG. 11 is a graph of weight (percent) versus temperature (degrees Celsius, °C.) showing the results of TGA analysis of InP/ZnS according to Example 1-1, InP/ZnS/Zn(Und)$_2$ according to Example 1-2, and InP/ZnS/Zn(Und)$_2$-EGMA according to Example 3.

The InP/ZnS of Example 1-1, the InP/ZnS/Zn(Und)$_2$ of Example 1-2, and the InP/ZnS/Zn(Und)$_2$-EGMA of Example 3 is analyzed by TGA analysis (10° C./min, N$_2$, room temperature (25° C.)-to 600° C., TA instruments Q5000IR). FIG. 11 shows the results of the TGA analysis. As shown in FIG. 11, the InP/ZnS of Example 1-1 and the InP/ZnS/Zn(Und)$_2$ of Example 1-2 show organic material decomposition of about 30%, while the InP/ZnS/Zn(Und)$_2$-EGMA of Example 3 shows organic material decomposition of about 80%. These results show that the EGMA of the InP/ZnS/Zn(Und)$_2$-EGMA of Example 3 includes a polymerized polymer.

Figure 12:
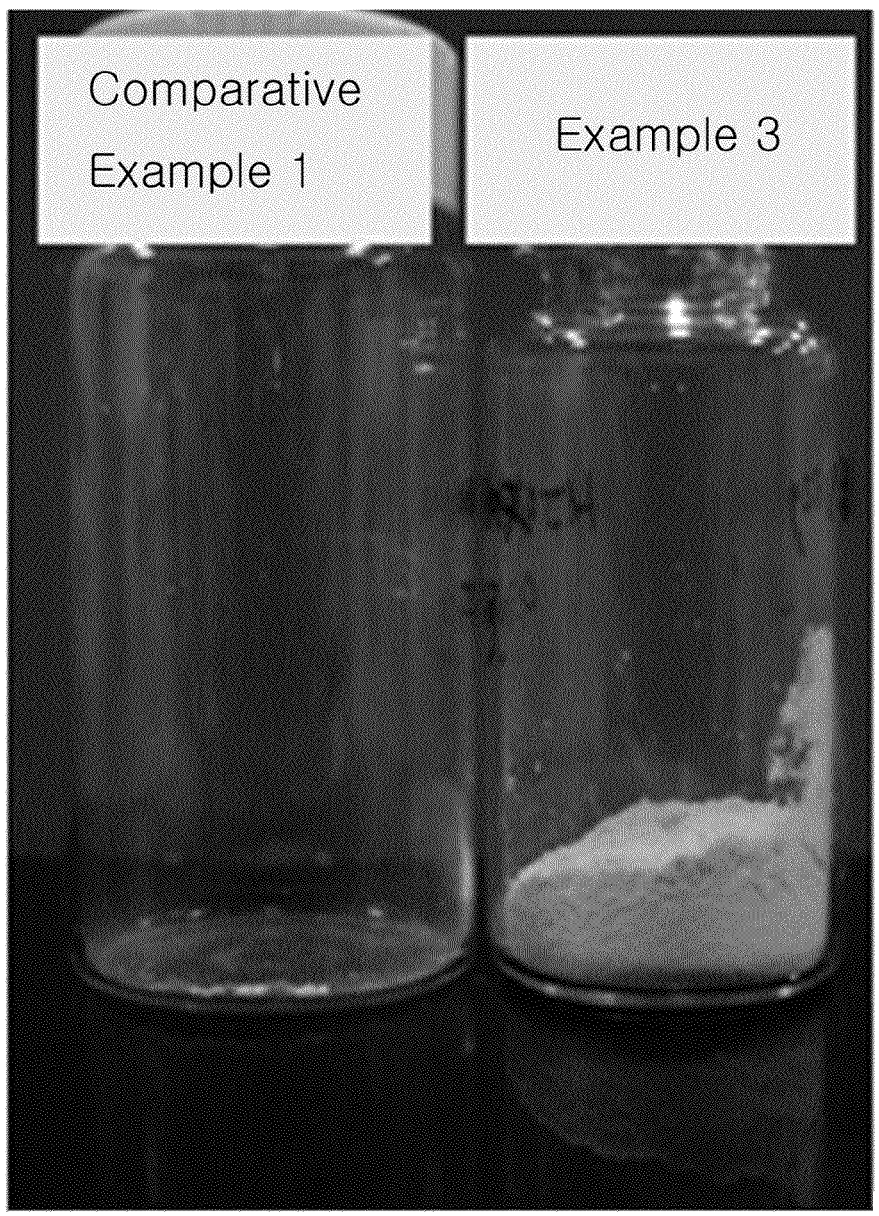
FIG. 12 is a photograph of a nanoparticle complex according to Example 3 and a semiconductor nanocrystal powder according to Comparative Example 1.
Figure 13:
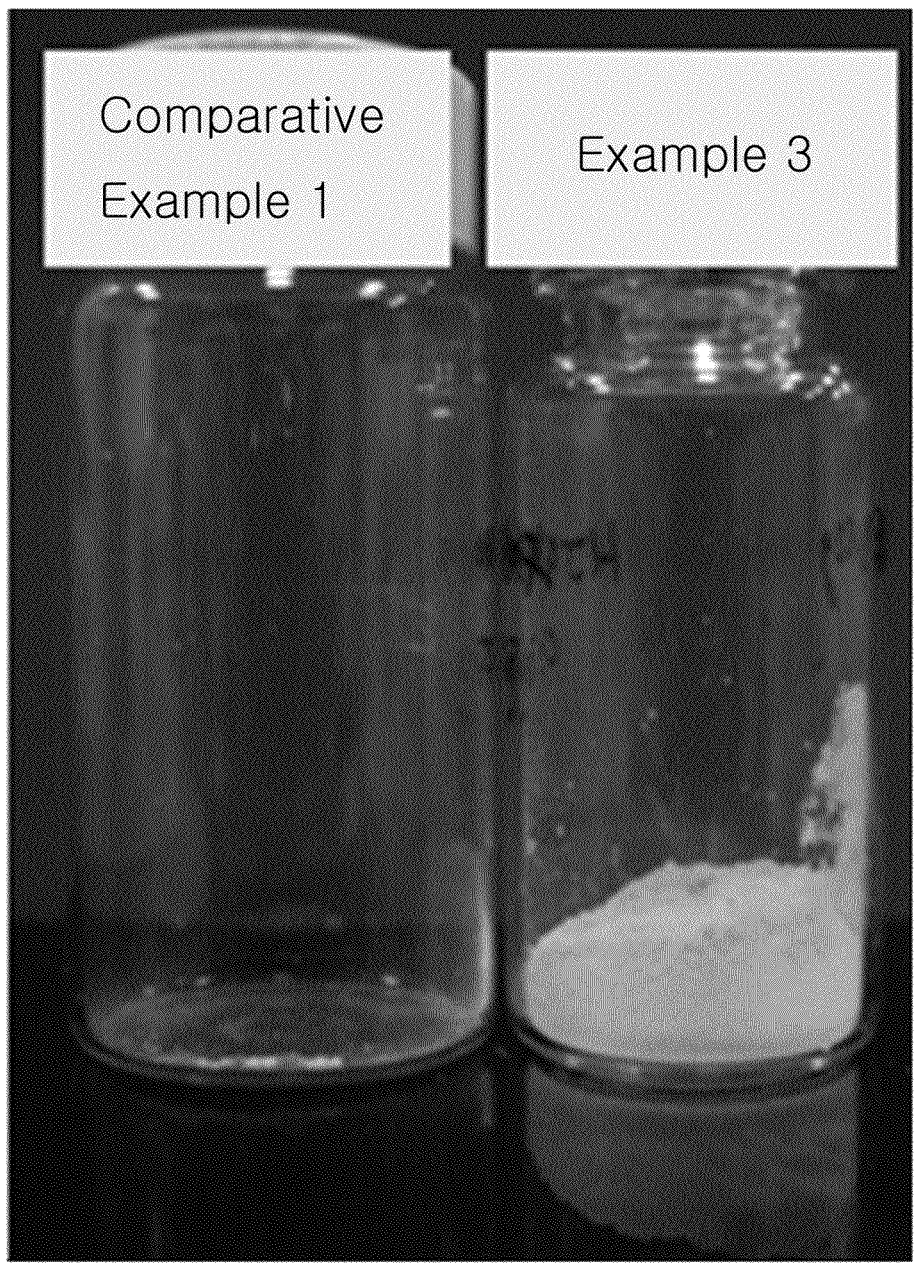
FIG. 13 is a photograph taken under 365 nm UV light of a nanoparticle complex according to Example 3 and a semiconductor nanocrystal powder according to Comparative Example 1.

FIG. 12 is a photograph of the nanoparticle complex according to Example 3 and the semiconductor nanocrystal powder according to Comparative Example 1 under a common daylight. FIG. 13 is a photograph of the nanoparticle complex according to Example 3 and the semiconductor nanocrystal powder according to Comparative Example 1 under a UV light having a wavelength of 365 nm. As shown in FIG. 12, Comparative Example 1 produces a small amount of white powder because EGMA does not substantially react with the InP/ZnS nanocrystal not including Zn(Und)$_2$ and is not substantially polymerized. However, Example 3 produces a large amount of pink powder because a nanoparticle complex is coated with Zn(Und)$_2$. FIG. 13 shows that the nanoparticle complex according to Example 3 provides stable red light emission. Because a vinyl group of undecylenate is highly concentrated around the InP/ZnS when the Zn(Und)$_2$ is coated on the surface of the InP/ZnS, EGMA is polymerized around the InP/ZnS semiconductor nanocrystals, forming a polymer composite.

Example 5

Fabrication of a Light Emitting Diode ("LED")

When the InP/ZnS/Zn(Und)$_2$ nanoparticle complex solution according to Example 1 has an optical density ("O.D.") of 0.1 (herein optical density is determined as the absorbance of the first absorption peak when a solution prepared by mixing 990 microliters (μL) of toluene with 10 μL of a nanoparticle complex solution is measured using UV light), 1 mL thereof is mixed with 1 mL of an epoxy resin (SJ-4500, SJC Co.). The mixture is treated with vacuum to remove vapor, providing a nanoparticle complex/epoxy resin mixture. Herein, a circuit board equipped with a Ag frame and having a light emitting diode chip emitting 445 nm blue light in the recess portion is used. The circuit board is coated with 5 μL of OE6630 resin (Dow corning) to cover the Ag frame and the light emitting diode chip in the recessed portion, and is then maintained at 150° C. in an oven for about one hour to harden a polydimethylsiloxane ("PDMS") resin and cooled to room temperature. Then, 15 μL of the nanoparticle complex/epoxy resin mixture is coated on the hardened PDMS resin to have a uniform thickness. Then, it is maintained at about 120° C. in an oven for one hour to harden the nanoparticle complex/epoxy resin mixture, fabricating a light emitting diode.

Example 6

Fabrication of a LED

A 0.05 g quantity of the InP/ZnS/Zn(Und)$_2$-EGMA according to Example 3 is mixed with 1 mL of an epoxy resin. The mixture is placed under vacuum to remove vapor to provide a nanoparticle complex/epoxy resin mixture. Then, a light emitting diode is fabricated according to the same method as Example 5, except that the nanoparticle complex/epoxy resin mixture is used.

Example 7

Fabrication of a LED

A 0.05 g quantity of the InP/ZnSeS/Zn(Und)$_2$-EGMA nanoparticle complex according to Example 4 is mixed with 1 mL of an epoxy resin. The mixture is placed under vacuum to remove vapor, providing a nanoparticle complex/epoxy resin mixture. A light emitting diode is fabricated according to the same method as Example 5, except the nanoparticle complex/epoxy resin mixture is used.

Comparative Example 2

Fabrication of a LED

A 1 mL quantity of the InP/ZnS nanoparticle complex solution prepared according to Example 1-1 is mixed with 1 mL of an epoxy resin having an O.D. of 0.1. The mixture is placed under vacuum to remove vapor, preparing a nanoparticle complex/epoxy resin mixture. Then, a light emitting diode is fabricated according to the same method as Example 5, except for using the nanoparticle complex/epoxy resin mixture.

Comparative Example 3

Fabrication of a LED

A 1 mL quantity of the InP/ZnSeS nanoparticle complex solution prepared according to Example 2-1 is mixed with 1 mL of an epoxy resin when it has an O.D. of 0.1. The mixture is placed under vacuum to remove vapor, providing a nanoparticle complex/epoxy resin mixture. Then, a light emitting diode is fabricated according to the same method as Example 5, except the nanoparticle complex/epoxy resin mixture is used.

Figure 14:
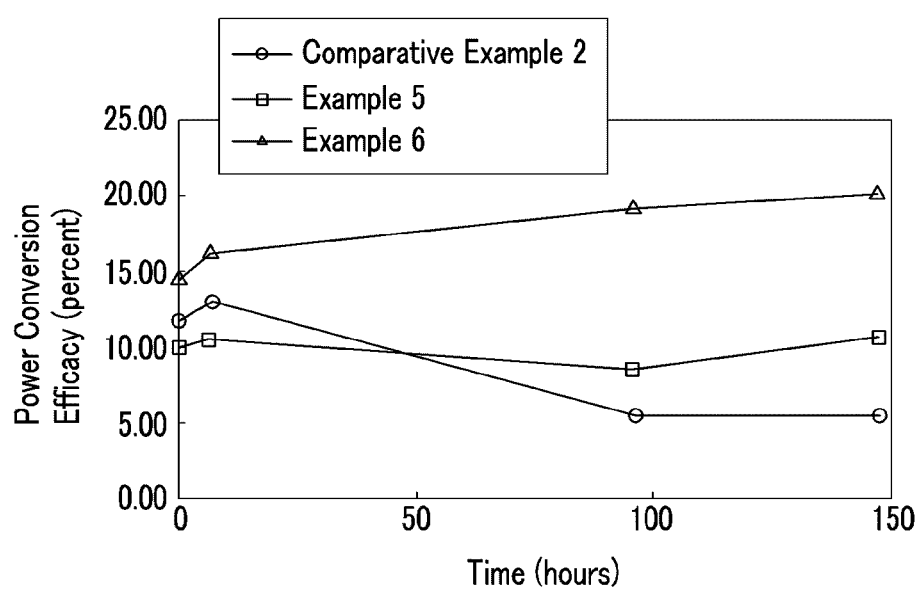
FIG. 14 is a graph of power conversion efficiency ("PCE", percent, %) versus time (hours) showing PCE change of light emitting diodes according to Examples 5 and 6 and Comparative Example 2.

The light emitting diodes according to Examples 5 and 6 and Comparative Example 2 are respectively operated with a current of 60 milliamperes (mA). Their power conversion efficiency ("PCE") (herein PCE is determined as (area of a light emitting spectrum due to a nanocrystal)/(area of a blue spectrum absorbed by nanocrystal)×100) is measured in an integrating sphere. FIG. 14 is a graph of PCE (percent, %) versus time, thus showing PCE change over time. The light emitting diodes according to Examples 5 and 6 and Comparative Example 2 initially have similar PCEs of 10%, 15%, and 12%, respectively. However, the LED including a nanoparticle complex coated with Zn(Und)$_2$ according to Example 5 has similar efficiency after 150 hours. The efficiency of the LED including a nanoparticle complex passivated by a polymer shell according to Example 6 is increased by 5% after 150 hours. Also, the efficiency of the LED including InP/ZnS according to Comparative Example 2 decreased.

Figure 15:
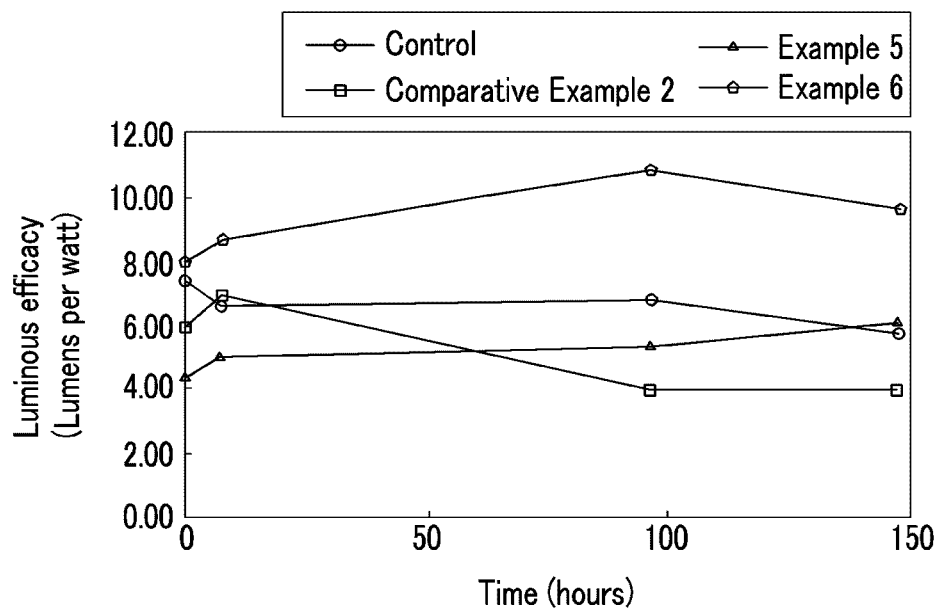
FIG. 15 is a graph showing luminous efficacy (lumens per watt, lm/W) versus time (hours) of light emitting diodes according to Examples 5 and 6 and Comparative Example 2.

Next, the light emitting diodes according to Examples 5 and 6 and Comparative Example 2 are operated with a 60 mA current and then measured to determine luminous efficacy, which has the units lumens per watt (lm/W). FIG. 15 shows the results. In order to show that the device does not have a defect, a light emitting diode without a nanoparticle complex is fabricated and provided in FIG. 15 (marked as control in FIG. 15). The light emitting diodes according to Examples 5 and 6 and Comparative Example 2 initially maintain similar luminous efficacy. However, the LED including the nanoparticle complex coated with Zn(Und)$_2$ according to Example 5 maintains similar luminous efficacy after 150 hours. The LED including a nanoparticle complex passivated by a polymer shell maintains excellent efficiency over time. On the contrary, the LED including InP/ZnS according to Comparative Example 2 has decreased efficiency over time.

Figure 16:
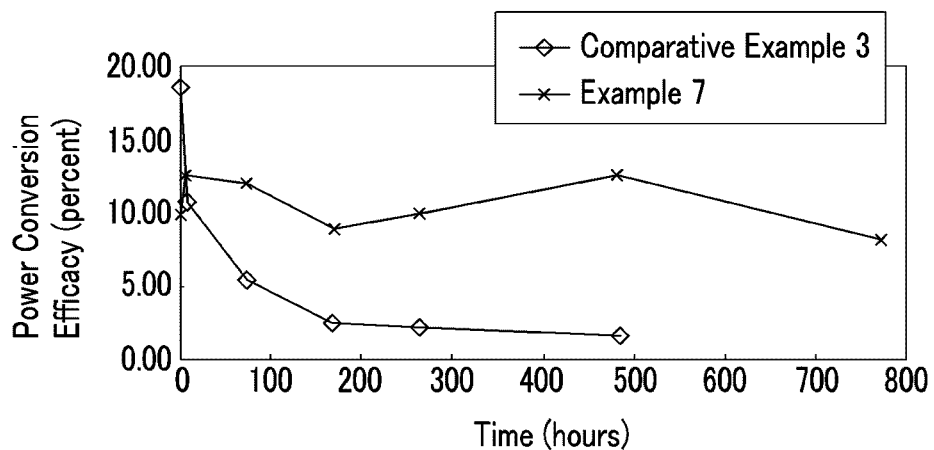
FIG. 16 is a graph of PCE (%) versus time (hours) showing PCE change of light emitting diodes according to Example 7 and Comparative Example 3.

This phenomenon is further distinguished when compared with a light emitting diode including InP/ZnSeS (Comparative Example 3) and another light emitting diode including InP/ZnSeS/Zn(Und)$_2$-EGMA (Example 7). Referring to FIG. 16, the LED of Comparative Example 3 has decreased PCE over time, and has 2% efficiency after 200 hours. However, the LED including a polymer shell according to Example 7 maintains about 10% efficiency for 700 hours or more.

Figure 17:
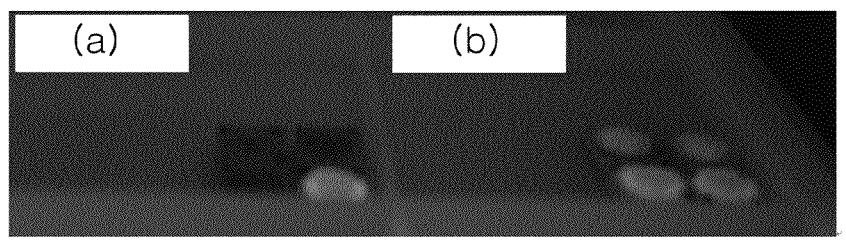
FIG. 17 is a photograph taken under 365 nm UV light of light emitting diodes according to Comparative Example 3 (a) and Example 7 (b) before and after 483 hours of operation.

FIG. 17 includes photographs taken of light emitting diodes of Comparative Example 3 (a) and Example 7 (b) immediately after starting operation and after 483 hours of operation under UV light at 365 nm. The diode at the lower right of photograph (a) of FIG. 17 represents a light emitting diode according to Comparative Example 3 immediately after starting operation. The other three diodes in photograph (a) represent light emitting diodes according to Comparative Example 3 after operating them for 483 hours. The light emitting diodes have no light emitting characteristics after 483 hours. In photograph (b) of FIG. 17, the two diodes at the bottom of photograph (b) represent light emitting diodes immediately after they started operation, while the two diodes on the top of photograph (b) represent light emitting diodes after they are operated for 483 hours. As shown in photograph (b) of FIG. 17, the light emitting diodes according to Example 7 have similar light emitting strength before and after operation under UV.

Therefore, a nanoparticle complex protected by a metal complex ligand or including a polymer shell may increase the stability and the efficiency of a semiconductor nanocrystal.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A nanoparticle complex comprising:
   a semiconductor nanocrystal;
   a metal complex ligand represented by the following Chemical Formula 1:

$(R_1)_m\text{-M-}(R_2)_n$  Chemical Formula 1 wherein the metal complex ligand of Chemical Formula 1 is on a surface of the semiconductor nanocrystal and M is bound to the surface of the semiconductor nanocrystal, and wherein M is a metal, m+n is the valence of M, and $R_1$ and $R_2$ are the same or different and are independently selected from the group consisting of a substituted or unsubstituted alkyl, a substituted or unsubstituted aryl, a substituted or unsubstituted heteroaryl, a substituted or unsubstituted oxyalkyl, a substituted or unsubstituted oxyaryl, and a combination thereof, optionally wherein a non-adjacent methylene or a phenylene in $R_1$ or $R_2$ is substituted with sulfonyl, carbonyl, ether, —S—, —S(O)—, and a combination thereof;

a polymer shell contacting the metal complex ligand, wherein the polymer shell comprises a polymer which is a product of a polymerizable monomer comprising a (meth)acrylate reactive functional group selected from an alkenyl group, an alkenyl group, an unsaturated aromatic group, and a (meth)acrylate group, and the metal is selected from the group consisting of zinc, indium, cadmium, magnesium, gallium, titanium, zirconium, hafnium, chromium, manganese, iron, cobalt, nickel, palladium, platinum, copper, silver, gold, and a combination thereof.

2. The nanoparticle complex of claim 1, wherein the semiconductor nanocrystal comprises a compound selected from the group consisting of a Group II-VI compound, a Group III-V compound, a Group IV-VI compound, a Group IV compound, and a combination thereof.

3. The nanoparticle complex of claim 1, wherein the semiconductor nanocrystal has a concentration gradient in which a concentration of an element of the semiconductor nanocrystal increases in a direction from a center of the semiconductor nanocrystal to an edge of the semiconductor nanocrystal; or the semiconductor nanocrystal further comprises a core/shell structure in which a concentration of an element of the shell increases in a direction from a core of the semiconductor nanocrystal to an edge of the semiconductor nanocrystal.

4. The nanoparticle complex of claim 1, wherein the metal complex ligand comprises a metal, which is the same as a metal of the semiconductor nanocrystal or is in a same periodic group as a periodic group of a metal of the semiconductor nanocrystal.

5. The nanoparticle complex of claim 1, wherein the metal complex ligand is present in an amount of about 0.1 to about 10 moles, based on 1 mole of a semiconductor nanocrystal, and binds equal to or greater than about 5 percent of an entire surface area of the semiconductor nano crystal.

6. The nanoparticle complex of claim 1, wherein the metal is zinc.

7. The nanoparticle complex of claim 6, wherein $R_1$ and $R_2$ are the same or different and are independently a substituted or unsubstituted oxyalkyl, wherein a non-adjacent methylene or a phenylene in $R_1$ or $R_2$ is substituted with carbonyl.

8. The nanoparticle complex of claim 7, wherein the metal complex ligand is zinc undecylenate.

9. A nanoparticle complex comprising:
a semiconductor nanocrystal;
a metal complex ligand wherein the metal complex ligand comprises a cross-linkable functional group at an end of the metal complex ligand, represented by the following Chemical Formula 2:

$(X_1\text{-}L_1)_m\text{-M-}(L_2\text{-}X_2)_n$  Chemical Formula 2 wherein the metal complex ligand of Chemical Formula 2 is on a surface of the nanoparticle and M is bound to the surface of the nanoparticle, and wherein M is a metal, m+n is the valence of M, $L_1$ and $L_2$ are the same or different and are independently selected from the group consisting of a substituted or unsubstituted alkylene, a substituted or unsubstituted arylene, a substituted or unsubstituted heteroarylene, a substituted or unsubstituted alkylene oxide, a substituted or unsubstituted arylene oxide, and a combination thereof, optionally wherein a non-adjacent methylene or a phenylene included therein is substituted with sulfonyl, carbonyl, ether, —S—, —S(O)—, or a combination thereof, and $X_1$ and $X_2$ are the same or different and are independently selected from the group consisting of a substituted or unsubstituted alkyl, a substituted or unsubstituted aryl, a substituted or unsubstituted heteroaryl, a substituted or unsubstituted oxyalkyl, a substituted or unsubstituted oxyaryl, a substituted or unsubstituted alkenyl, a substituted or unsubstituted alkynyl, an unsaturated aromatic group, a halogen, —ROR' wherein R is a substituted or unsubstituted alkylene and R' is hydrogen or an alkyl, an acyl halide of the formula —RCOX wherein R is a substituted or unsubstituted alkylene and X is a halogen, —RCOOR' wherein R is a substituted or unsubstituted alkylene and R' is hydrogen or an alkyl, an amide, an amine, an imine, an imide, an isocyanate, a (meth)acrylate, a thiol, a phosphine, a phosphine oxide, —SO$_3$H, —NO$_2$, and a combination thereof, and at least one of $X_1$ and $X_2$ is selected from the group consisting of a substituted or unsubstituted alkenyl, a substituted or unsubstituted alkynyl, an unsaturated aromatic group, a halogen, —ROR' wherein R is a substituted or unsubstituted alkylene, and R' is hydrogen or an alkyl, an acyl halide of the formula —RCOX wherein R is a substituted or unsubstituted alkylene and X is a halogen, —RCOOR' wherein R is a substituted or unsubstituted alkylene and R' is hydrogen or an alkyl, an amide, an amine, an imine, an imide, an isocyanate, a (meth)acrylate, a thiol, a phosphine, a phosphine oxide, —SO$_3$H, —NO$_2$, and a combination thereof;

a polymer shell contacting the metal complex ligand, wherein the polymer shell comprises a polymer which is a product of a polymerizable monomer comprising a reactive functional group selected from an alkenyl group, an alkynyl group, an unsaturated aromatic group, a (meth)acrylate group, and the metal is selected from the group consisting of zinc, indium, cadmium, magnesium, gallium, titanium, zirconium, hafnium, chromium, manganese, iron, cobalt, nickel, palladium, platinum, copper, silver, gold, and a combination thereof.

10. The nanoparticle complex of claim 9, wherein the nanoparticle is selected from the group consisting of a semiconductor nanocrystal, a metal particle, a metal oxide particle, and a combination thereof.

11. The nanoparticle complex of claim 10, wherein the semiconductor nanocrystal comprises a compound selected from the group consisting of a Group II-VI compound, a Group III-V compound, a Group IV-VI compound, a Group IV compound, and a combination thereof.

12. The nanoparticle complex of claim 10, wherein the semiconductor nanocrystal has a concentration gradient in which a concentration of an element of the semiconductor nanocrystal increases in a direction from a center of the semiconductor nanocrystal to an edge of the semiconductor nanocrystal; or the semiconductor nanocrystal further comprises a core/shell structure in which a concentration of an element of the shell increases in a direction from an interface of the shell and the core to an edge of the shell.

13. The nanoparticle complex of claim 10, wherein the metal particle is selected from the group consisting of palladium, platinum, nickel, cobalt, rhodium, iridium, iron, rubidium, gold, silver, copper, and a combination thereof.

14. The nanoparticle complex of claim 10, wherein the metal oxide particle comprises a metal oxide selected from the group consisting of silicon, titanium, cobalt, tin, aluminum, zinc, indium, zirconium, nickel, hafnium, vanadium, and a combination thereof.

15. The nanoparticle complex of claim 9, wherein the metal complex ligand binds equal to or greater than about 5 percent of an entire surface area of the nanoparticle and is present in an amount of about 0.1 to about 10 moles, based on 1 mole of the nanoparticle.

16. The nanoparticle complex of claim 9, wherein the polymer is bonded to at least one ligand of the metal complex ligand.

17. The nanoparticle complex of claim 9, wherein the metal is zinc.

18. The nanoparticle complex of claim 17, wherein $L_1$ and $L_2$ are each a carbonyl substituted alkylene oxide, and $X_1$ and $X_2$ are a substituted or unsubstituted alkenyl.

19. A method of manufacturing a nanoparticle complex, the method comprising:

synthesizing a semiconductor nanocrystal;

binding a surface of the nanoparticle with a metal complex ligand, wherein M of the metal complex ligand is bound to the surface of the nanoparticle to form a bound nanoparticle, and wherein the metal complex ligand is represented by the following Chemical Formula 1:

$$(R_1)m\text{-}M\text{-}(R_2)n;\qquad\text{Chemical Formula 1}$$

and adding the bound nanoparticle to a combination comprising a polymerizable monomer or a polymer comprising a reactive functional group to form a polymer shell on the bound nanoparticle to form the nanoparticle complex, the polymer shell contacting the metal complex ligand, wherein the polymer shell comprises a polymer which is a product of a polymerizable monomer comprising a reactive functional group selected from an alkenyl group, an alkenyl group, an unsaturated aromatic group, and a (meth)acrylate group, and the metal is selected from the roue consisting of zinc, indium, cadmium, magnesium, gallium, titanium, zirconium, hafnium, chromium, manganese, iron, cobalt, nickel, palladium, platinum, copper, silver, gold, and a combination thereof.

20. The method of claim 19, wherein the synthesizing, binding and adding are performed in situ.

21. A device comprising the nanoparticle complex according to claim 1.

\* \* \* \* \*